United States Patent
Frederick et al.

(10) Patent No.: US 8,169,335 B2
(45) Date of Patent: May 1, 2012

(54) ELECTROMAGNETIC FIELD ADJUSTMENT FOR PROXIMITY DETECTION

(75) Inventors: Larry D. Frederick, Huntsville, AL (US); Dwight Medley, Fayetteville, TN (US)

(73) Assignee: Strata Proximity Systems, LLC, Pittsburgh, PA (US)

( * ) Notice: Subject to any disclaimer, the term of this patent is extended or adjusted under 35 U.S.C. 154(b) by 411 days.

(21) Appl. No.: 12/409,809

(22) Filed: Mar. 24, 2009

(65) Prior Publication Data

US 2009/0256715 A1 Oct. 15, 2009

Related U.S. Application Data

(60) Provisional application No. 61/064,733, filed on Mar. 24, 2008.

(51) Int. Cl.
*G08B 21/00* (2006.01)
(52) U.S. Cl. ............... 340/686.6; 340/691.7; 340/573.4
(58) Field of Classification Search ............... 340/686.6, 340/573.4, 686.4, 691.1, 686.5, 691.7
See application file for complete search history.

(56) References Cited

U.S. PATENT DOCUMENTS

| | | | |
|---|---|---|---|
| 2,957,115 A | 10/1960 | Clark et al. | |
| 3,064,257 A | 11/1962 | Guest | |
| 3,926,792 A * | 12/1975 | Buford | 209/636 |
| 4,818,855 A | 4/1989 | Mongeon et al. | |
| 4,947,759 A * | 8/1990 | Uhl | 104/299 |
| 5,351,004 A * | 9/1994 | Daniels et al. | 324/207.13 |
| 5,793,175 A * | 8/1998 | Journey | 318/493 |
| 6,657,351 B2 * | 12/2003 | Chen et al. | 310/171 |
| 6,724,191 B1 | 4/2004 | Larsen | |
| 7,142,167 B2 * | 11/2006 | Rochelle et al. | 343/867 |
| 2003/0227268 A1 | 12/2003 | Smith | |
| 2006/0087443 A1* | 4/2006 | Frederick et al. | 340/686.6 |
| 2007/0108297 A1* | 5/2007 | Bates | 235/492 |

OTHER PUBLICATIONS

International Search Report, dated Mar. 24, 2008.
Written Opinion of the International Searching Authority, dated Jun. 9, 2009.

* cited by examiner

*Primary Examiner* — Daniel Previl
(74) *Attorney, Agent, or Firm* — Dickstein Shapiro LLP

(57) ABSTRACT

Embodiments described herein relate to a methods and apparatus for optimizing and calibrating a magnetic field generator. In various embodiments, the magnetic field generator includes a signal generator for outputting a voltage and a magnetic field generating circuit including a shunt that may be used to change a value of inductance in the magnetic field generating circuit.

30 Claims, 12 Drawing Sheets

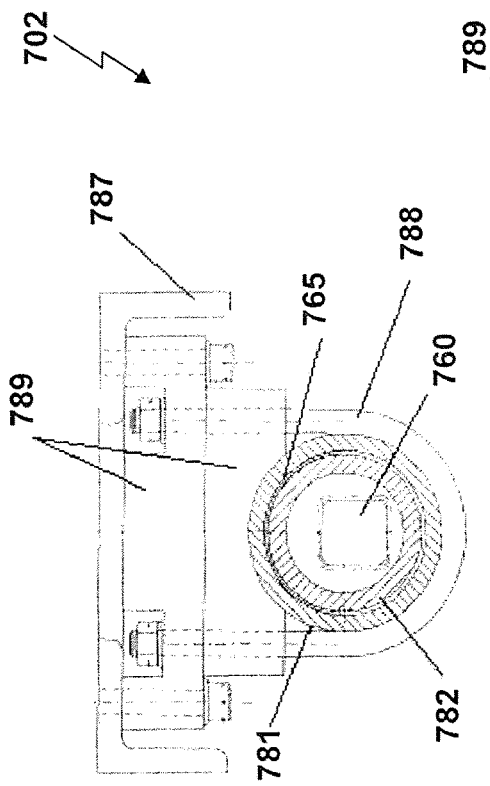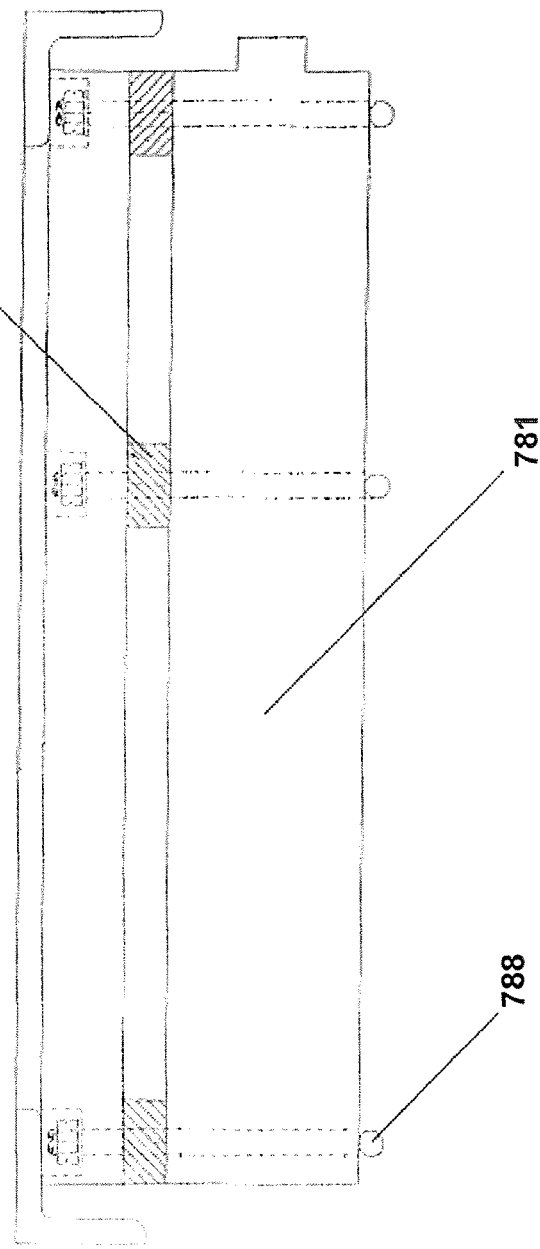

ELECTROMAGNETIC FIELD ADJUSTMENT FOR PROXIMITY DETECTION

CROSS-REFERENCE TO RELATED APPLICATIONS

This application claims the benefit of U.S. Provisional Application No. 61/064,733, filed on Mar. 24, 2008, the subject matter of which is incorporated in its entirety by reference herein.

BACKGROUND

Various embodiments described generally relate to safety systems at work sites, and in particular to a proximity detection system and methods of adjusting an electromagnetic filed produced by the same.

Many methods have been devised to protect people from being struck, pinched, crushed or otherwise harmed by vehicles and mobile equipment used for above and below ground operations. Examples of the equipment include: road construction equipment such as trucks, road graders, rollers and pavers; surface mining equipment, such as for use with gravel and sand operations, front end loaders, trucks, dozers, conveyors and other items; underground mining equipment such as continuous miners, shuttle cars, conveyors, crushers, load-haul-dump vehicles, man-trips, tractors; and other equipment such as fork lifts, cranes, and trucks used at warehouses and shipping ports.

A number of different proximity detection systems have been devised to protect people and property in these industrial operations, such as the systems disclosed in U.S. Patent Application Publication No. 2006/0087443, and U.S. Pat. Nos. 6,810,353 and 5,939,986, which are incorporated by reference herein in their entirety. These proximity detection systems establish a warning zone around dangerous equipment or areas by generating a magnetic field perimeter. A worker who enters the magnetic field perimeter carrying a magnetic field detection device is warned of his or her presence within the magnetic field perimeter and his or her corresponding proximity to the dangerous vehicle. To maintain a warning zone of an appropriate size, the proximity detection systems may be calibrated or otherwise optimized at a factory or laboratory before installing the system in the field.

However, industrial environments involve a wide range of climatic and environmental conditions that may cause a proximity detection system to perform differently under field conditions compared to the controlled conditions in a laboratory or factory. In some cases, the size of the magnetic filed perimeter created by the proximity detection system in the field may be significantly different from the size of the perimeter created under ideal conditions. Therefore, there is a need to be able to adjust a proximity detection system at the time of installation, or thereafter, to optimize performance and/or to calibrate the system to the desired operational settings.

SUMMARY

When a proximity detection system is installed or is in use in the field, the system may need to be calibrated and/or optimized to account for variable conditions such as changes in cable lengths, interference to the magnetic field from the equipment it is mounted to, substitution of system elements, temperature, moisture, degradation of components over time, and the like. Various embodiments described herein provide methods and apparatus to make adjustments to the proximity detection system during or after installation.

In one embodiment described herein, a magnetic field generator includes a signal generator for outputting a voltage and a magnetic field generating circuit for generating a magnetic field. The magnetic field generating circuit includes a capacitor and an inductor comprising a ferrite core. The magnetic field generator also includes a shunt movably supported relative to the inductor such that moving the shunt changes a value of inductance in the magnetic field generating circuit.

In another embodiment described herein, a method for adjusting the resonance of a magnetic field generator includes installing a magnetic field generator at a location at which the magnetic field generator is to be used. The magnetic field generator includes a signal generator for outputting a voltage, a magnetic field generating circuit for generating a magnetic field, and a shunt movably supported relative to the inductor. The magnetic field generating circuit includes a capacitor and an inductor having a ferrite core. The shunt is supported relative to the inductor in such a way so that moving the shunt changes a value of inductance in the magnetic field generating circuit. The method includes moving the shunt relative to the inductor to increase the resonance of the magnetic field generating circuit for a given voltage.

In another embodiment described herein, a safety system includes a plurality of alarm devices for detecting a magnetic field, and a magnetic field generator. The magnetic field generator includes a signal generator for outputting a voltage, a capacitor in electronic communication with the signal generator, an inductor in electronic communication with the capacitor, and a ferrite core at least partially surrounded by the inductor. The magnetic field generator also includes and a shunt movably supported relative to the inductor in such a way so that moving the shunt changes a value of inductance in the magnetic field generator.

In another embodiment described herein, a method for adjusting the range of a magnetic field generated by a magnetic field generator includes installing a magnetic field generator at a location at which the magnetic field generator is to be used, positioning a personal alarm device at a distance from the magnetic field generator, generating a magnetic field using the magnetic field generator so that the magnetic field encompasses the personal alarm device, and detecting the magnetic field with the personal alarm device. The method further includes decreasing the magnetic field size until the personal alarm device cannot detect the magnetic field, incrementally increasing the magnetic field size until the personal alarm device detects the magnetic field, and setting the magnetic field size equal to the magnetic field size at which the personal alarm device detected the magnetic field.

In another embodiment described herein, an apparatus for adjusting the magnetic field strength of a magnetic field generator includes a magnetic field generator. The magnetic field generator includes a signal generator for outputting a voltage and a magnetic field generating circuit for generating a magnetic field. The magnetic field generating circuit includes a capacitor and an inductor comprising a ferrite core. The magnetic field generator further includes a shunt movably supported relative to the inductor such that moving the shunt changes a value of inductance in the magnetic field generating circuit, a controller for controlling the magnetic field generating circuit, and a voltage divider circuit. The voltage divider circuit is positioned electrically in parallel with the inductor of the magnetic field generating circuit and outputs a voltage to the controller. The controller inputs a voltage from the voltage divider circuit and uses the inputted voltage to control the voltage output by the signal generator, thereby controlling the strength of the magnetic field.

In another embodiment described herein, a method for adjusting the strength of a magnetic field generated by a magnetic field generator includes installing a magnetic field generator at a location at which the magnetic field generator is to be used, positioning a personal alarm device at a distance from the magnetic field generator, and generating a magnetic field using the magnetic field generator so that the magnetic field encompasses the personal alarm device. The magnetic field generator includes a signal generator for outputting a voltage, a controller, a capacitor, and an inductor. The method further includes detecting the magnetic field with the personal alarm device, decreasing the magnetic field size until the personal alarm device cannot detect the magnetic field, incrementally increasing the magnetic field size until the personal alarm device detects the magnetic field, determining and storing in the controller the voltage across the inductor of the magnetic field generator at which the personal alarm device first detects the magnetic field, and adjusting the signal generator using the controller to keep the voltage across the inductor at the same level as when the personal alert device was first detected.

In another embodiment described herein, a method for adjusting the range of a magnetic field generated by a magnetic field generator for a proximity detection system includes installing a magnetic field generator at a location at which the magnetic field generator is to be used, selecting a power level of the magnetic field generator less than the maximum power level of the magnetic field generator and generating a magnetic field by operating the magnetic field generator at the selected power level. The method includes adjusting the position of a shunt relative to the magnetic field generator to maximize the magnetic field size of the magnetic field generator at the selected power level, positioning a personal alarm device at a distance from the magnetic field generator, and detecting the magnetic field with the personal alarm device. If the magnetic field is not detected by the personal alarm device, the method further includes incrementally increasing the magnetic field size until the personal alarm device detects the magnetic field and setting the magnetic field size equal to the magnetic field size at which the personal alarm device detected the magnetic field.

BRIEF DESCRIPTION OF THE DRAWINGS

FIGS. 8 and 9 are diagrams of a portion of an exemplary magnetic field generator of the system of FIG. 2 in accordance with another embodiment described herein.

DETAILED DESCRIPTION OF PREFERRED EMBODIMENTS

In the following detailed description, reference is made to the accompanying drawings which form a part hereof, and in which are shown by way of illustration specific embodiments that may be practiced. These embodiments are described in sufficient detail to enable those of ordinary skill in the art to make and use them, and it is to be understood that structural, logical, or procedural changes may be made to the specific embodiments disclosed herein.

Figure 1:
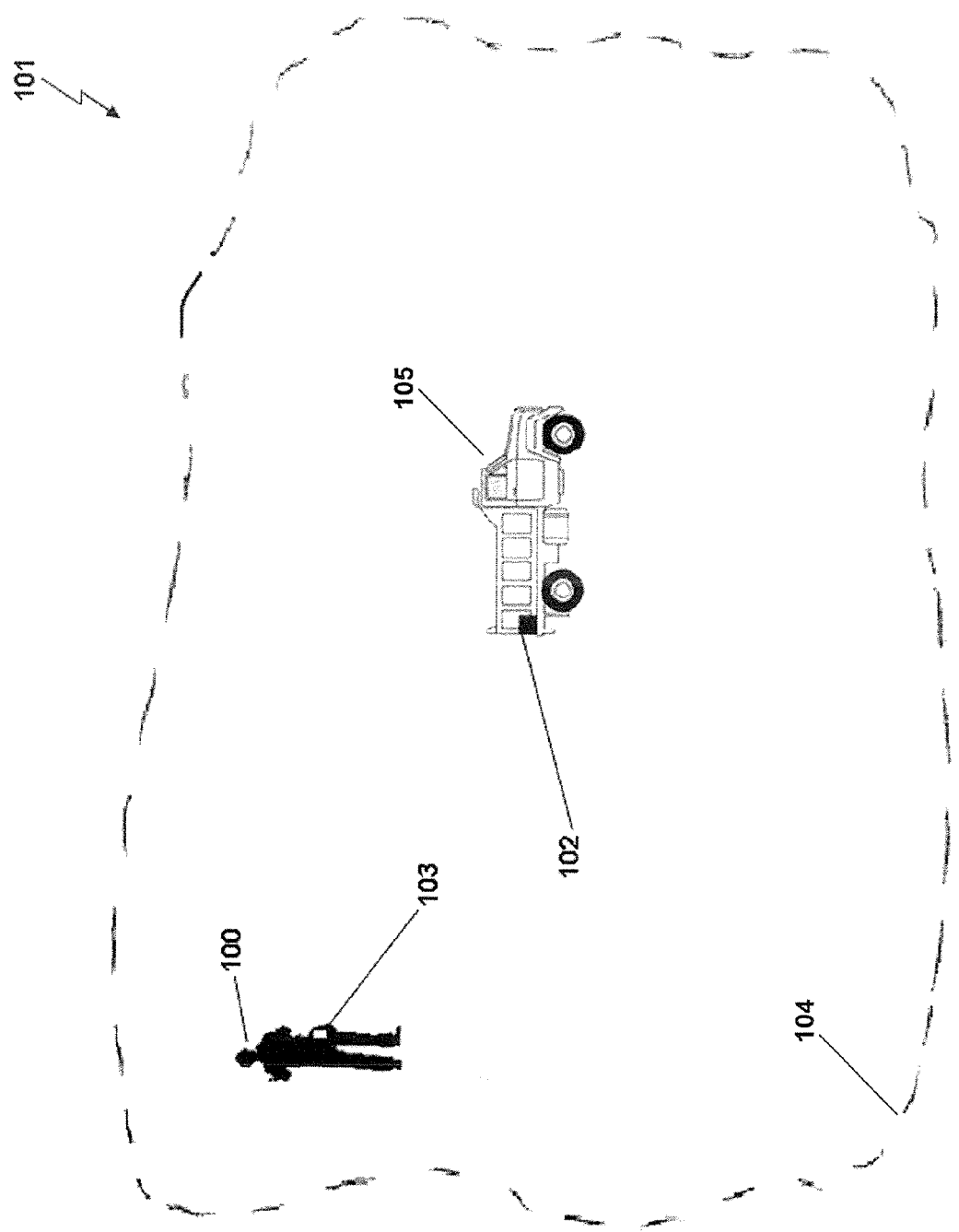
FIG. 1 is a diagram of an exemplary proximity detection system in accordance with an embodiment described herein.

FIG. 1 shows an exemplary proximity detection system 101 that may be used to warn personnel if they are dangerously close to equipment or to other dangerous zones within a mine or above ground. A protection zone is established by a magnetic field generator 102 that creates a pulsating low frequency oscillating magnetic marker field 104 around the equipment 105. The magnetic marker field 104 is detected by a personal alarm device 103 worn or otherwise carried by a person 100. If the person 100 wearing the personal alarm device 103 enters the magnetic marker field 104, the personal alarm device 103 will emit an audible warning and a display on the equipment 105 will provide a visual and/or audible warning to the operator of the equipment 105. Where applicable, the system 101 may be capable of issuing a command to slow or stop the equipment 105 if the person 100 enters the magnetic marker filed 104.

To provide a protection zone of a proper size around a particular piece of equipment 105, it may be desirable to optimize or otherwise calibrate the magnetic field generator 102 to maintain the magnetic marker field 104 at a constant size. However, industrial environments involve a wide range of climatic and environmental conditions and the magnetic field generator 102 may perform differently under field conditions compared to the controlled conditions in a laboratory or factory where the magnetic field generator 102 may have been optimized or calibrated. Therefore, various embodiments described herein provide systems and methods to optimize and/or calibrate the proximity detection system 101 at the time of installation, or thereafter.

Figure 2:
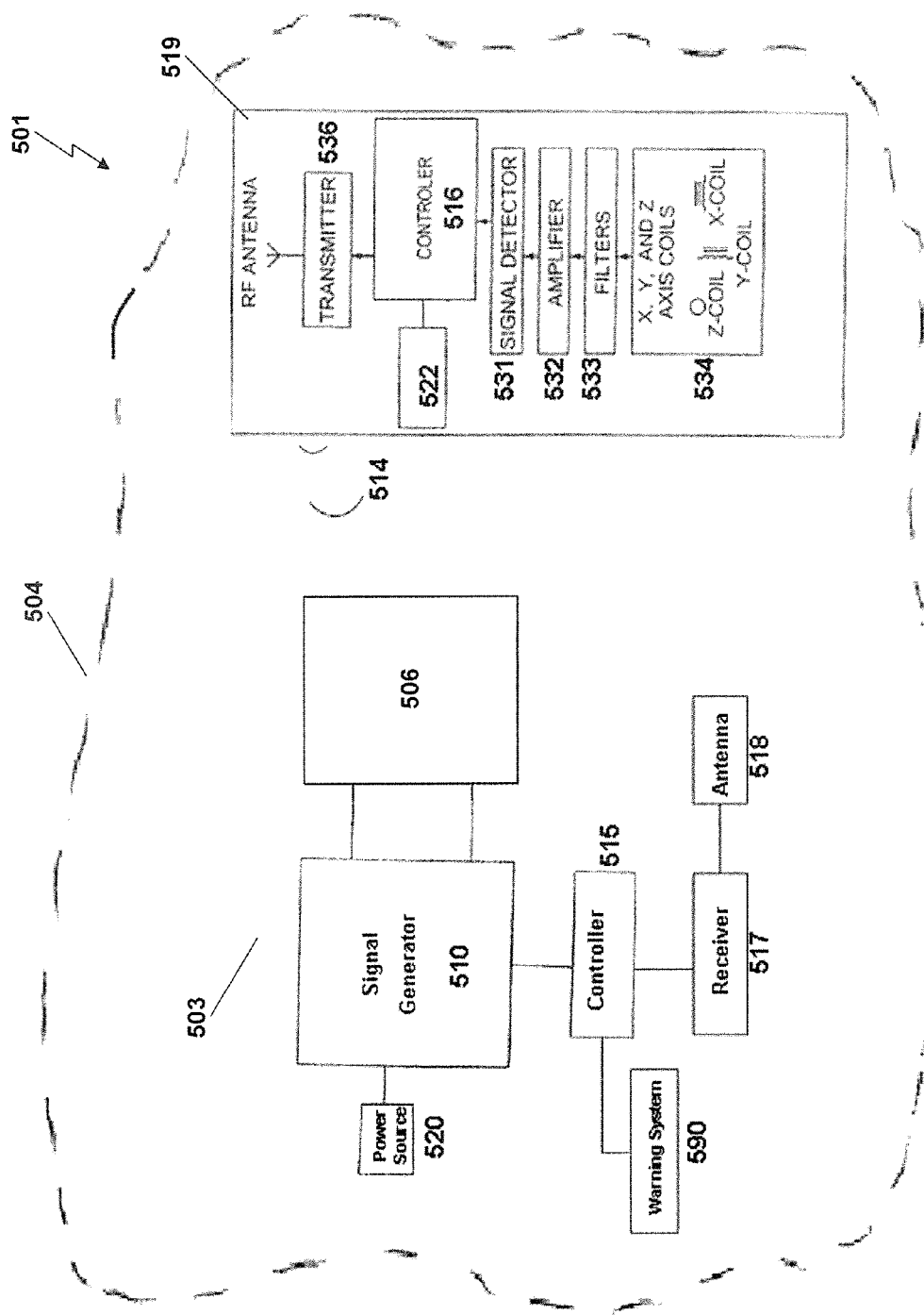
FIG. 2 is a diagram of an exemplary proximity detection system in accordance with an embodiment described herein.

FIG. 2 is a diagram of an exemplary proximity detection system 501 in accordance with an embodiment further described below. A magnetic field generator 502 includes a signal generator 510 connected to a magnetic field generating circuit 506. Various embodiments of magnetic field generating circuits 506 are described in greater detail below and in FIGS. 3, 4, and 5. The magnetic field generating circuit 506 generates a magnetic field 504 in response to an input voltage from the signal generator 510. The signal generator 510 is also connected to a power source 520 which supplies power to the magnetic field generator 502. A controller 515 is connected to the signal generator 510 and controls the voltage and current outputs of the signal generator 510. The controller 515 is also connected to a receiver 517 and warning system 590. The receiver 517 is connected to an antenna 518 which receives an input signal 514 from a personal alarm device 503. The antenna 518 conveys the signal 514 to the receiver 517 which passes the signal 514 to the controller 515. Upon receiving the signal 514 from the personal alarm device 503, the controller 515 directs the warning system 590 to issue a warning. In one embodiment, the warning system 590 may issue an audio and/or visual warning. In another embodiment, the warning system 590 may be capable of terminating the operation of a vehicle to which the warning system 590 is mounted.

The personal alarm device 503 has x, y, and z axis magnetic field antennas 534 that sense the magnetic field 504 produced by the magnetic field generator 502. The sensed magnetic field signal 504 is passed through filters 533 and an amplifier 532 to a signal detector 531. The signal detector 531 then passes information about the detected signal to a controller 516. The controller 516 activates a transmitter 536 which transmits a corresponding response signal 514 to the magnetic field 504 through a RF antenna 519. In one embodiment, the response signal 514 is an RF signal. The personal alarm device 503 is powered by power source 522. The personal alarm device 503 may be carried by a worker in order to provide the worker with a warning of their proximity to a magnetic field generator 502. In another embodiment, the personal alarm device 503 may be mounted on a vehicle or other piece of equipment to which a proximity warning is sought. In another embodiment, the magnetic field generator 502 may be mounted in a location in which it is desirable to warn a worker carrying a personal alarm device 503 of their proximity.

Figure 3:
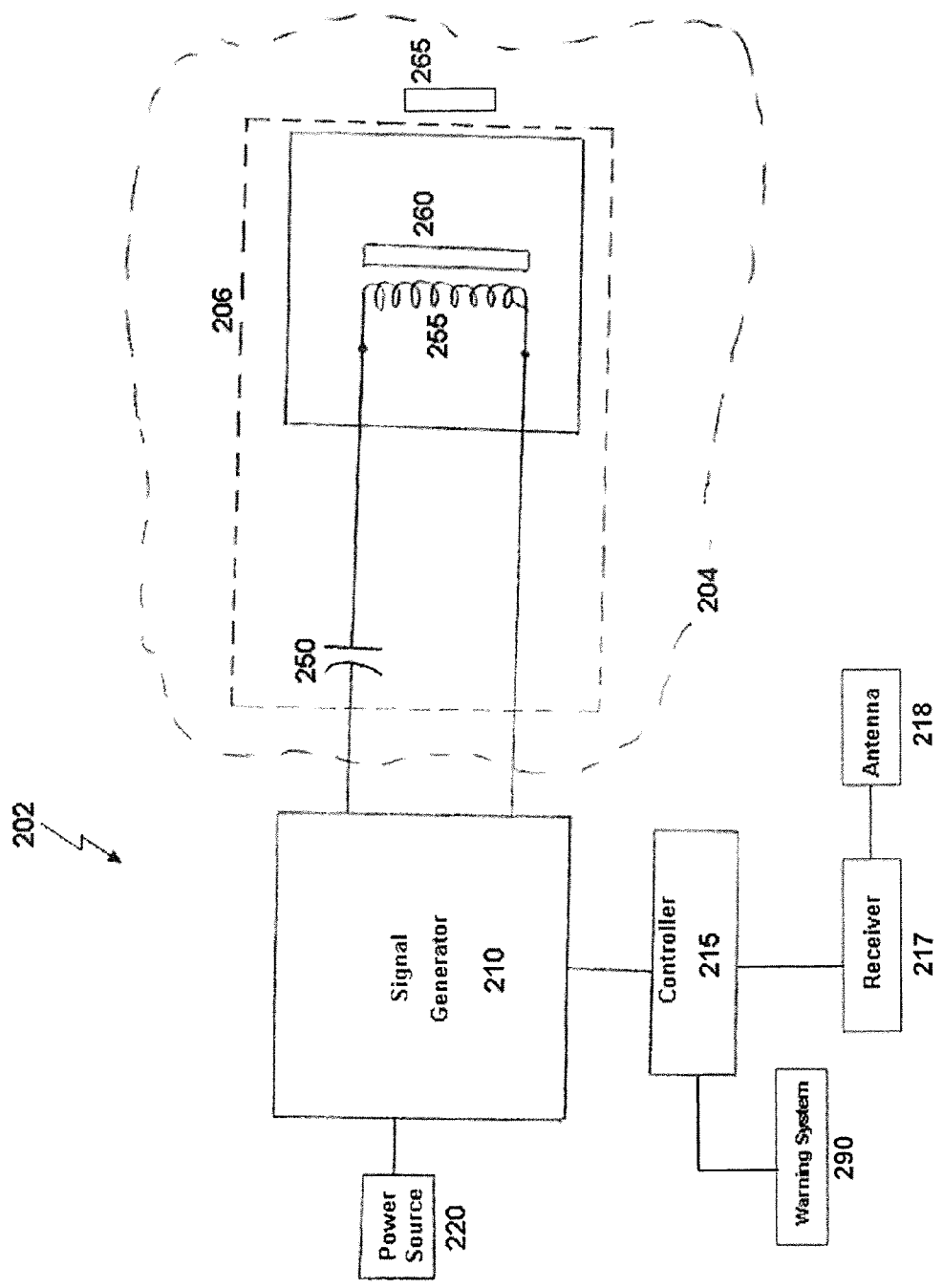
FIG. 3 is a diagram of an exemplary magnetic field generator of the system of FIG. 2 in accordance with a first embodiment described herein.

FIG. 3 is a diagram of an exemplary magnetic field generator 202 of the system of FIG. 2 in accordance with a first embodiment described herein. A power source 220 powers a signal generator 210 that generates a voltage across the series circuit 206. The series circuit 206 includes an inductor 255 and a ferrite core 260. In one embodiment, the inductor 255 at least partially surrounds the ferrite core 260. The series circuit 206 also includes a capacitor 250 connected in series with the inductor. A controller 215 is connected to and controls the operation of the signal generator 210. The magnetic field generator 202 includes a warning system 290, receiver 217, and antenna 218 similar to those described with regard to FIG. 2. The magnetic field generator 202 also includes a movable shunt 265.

The signal generator 210 produces low frequency voltage oscillations. In one embodiment, the oscillations of the signal generator 210 occur between approximately 25 kHz to 100 kHz. In another embodiment, the oscillations of the signal generator 210 may be at a frequency of approximately 73 kHz. The voltage oscillations produced by the signal generator 210 are applied to the inductor 255 through the capacitor 250 and result in an oscillating magnetic field 204. The magnetic field 204 produced by the magnetic field generator 202 expands and collapses around the magnetic field generator at a frequency equal to that of voltage oscillations produced by the signal generator 210.

The controller 215 controls the operation of the signal generator 210 to manage the frequency and magnitude of the voltage oscillations produced by the signal generator 210. The controller 215 may control the size of the magnetic field 204 by controlling the duration of voltage pulses produced by the signal generator 210. For example, an increase in the duration of voltage pulses provided to the series circuit 206 by the signal generator 210 will create a larger magnetic field 204. Conversely, shorter voltage pulses provided to the series circuit 206 will create a smaller magnetic field 204. The size of the magnetic field 204 may also be controlled by adjusting the magnitude of the voltage oscillations produced by the signal generator 210. For example, a voltage oscillation of higher magnitude results in a larger magnetic field 204, while a voltage oscillation of lower magnitude will result in a smaller magnetic field 204.

The size of the magnetic field 204 may also be adjusted by manipulating the resonance of the series circuit 206. The series circuit 206 containing the inductor 255 and capacitor 250 will have a given resonance at which charge passes between the inductor 255 and capacitor 250. A charge stored on the capacitor 250 will discharge across the inductor 255. The inductor 255 creates a magnetic field 204 in which energy is stored as the charge passes through the inductor 255. Once the capacitor 250 is discharged, the energy stored in the magnetic field 204 by the inductor 255 begins to be reconverted into electrical energy and a charge of opposite polarity to the original charge is stored on the capacitor 250. This cycle continues indefinitely producing the same magnitude charge on the capacitor 250 and the same magnitude magnetic field 204 in the absence of resistance within the circuit 206. The frequency of the oscillations depends upon the absolute values of the inductance of the inductor 255 and capacitance of the capacitor 250. The resonant frequency of the circuit 206 is the frequency at which the oscillations occur when the absolute values of the inductance of the inductor 255 and capacitance of the capacitor 250 are equal.

In one embodiment, the resonance of the inductor 255 and the capacitance of the capacitor 250 may be approximately equal. For example, the inductance of the inductor 255 may be approximately 300 microHenry and the capacitance of the capacitor 250 may be approximately 163 microfarad. Other suitable values of inductance and capacitance may also be used, for example, to create a series circuit 206 in which a maximum current is passed through the inductor 255 while using a minimum voltage. In one embodiment, the values for the inductance of the inductor 255 and capacitance of the capacitor 250 may be chosen to maximize the resonance of the series circuit 206.

The resonance of the series circuit 206 may be adjusted by a shunt 265 positioned adjacent to or otherwise near the inductor 255. In one embodiment, the shunt 265 is positioned next to the inductor 255. In another embodiment, the shunt 265 at least partially surrounds the inductor 255 and the ferrite core 260. For instance, the shunt 265 may be on only one side of the ferrite core 260, two sides, three sides, or completely surround the ferrite core 260. The shunt 265 may be semi-cylindrical, cylindrical, flat with various shapes, such as square, bent at an angle, such as a 90 degree angle, or other shapes. The shunt 265 may be constructed from aluminum, copper, or other suitable non-ferric metals and alloys.

Movement of the shunt 265 in relation to the inductor 255 and ferrite core 260 changes a value of inductance of the inductor 255. The change in inductance of the inductor 255 in turn changes the resonance of the series circuit 206. In one embodiment, the shunt 265 may be moved relative to the inductor 255 and ferrite core 260 so as to maximize the resonance of the series circuit 206 at a given voltage produced by the signal generator 210. For instance, if the shunt 265 is positioned near the center of the longitudinal axis of the ferrite core 260, the inductance of the inductor 255 is reduced a minimal amount. The inductance of the inductor 255 decreases by a larger amount as the shunt 265 is moved away from the center of the ferrite core 260 and towards either end of the ferrite core 206. In an embodiment, the shunt 265 may be moved anywhere along the length of the ferrite core 260. In another embodiment, the shunt 265 may be moved from the center of the ferrite core 260 to beyond the ends of the ferrite core 260. Furthermore, the shunt 265 may be movably supported in relation to the ferrite core 260 in any suitable manner. For instance, the shunt 265 may be mounted on a housing surrounding the ferrite core 260, upon an object at distance from the ferrite core 260, or in any other manner in relation to the ferrite core 260.

Figure 4:
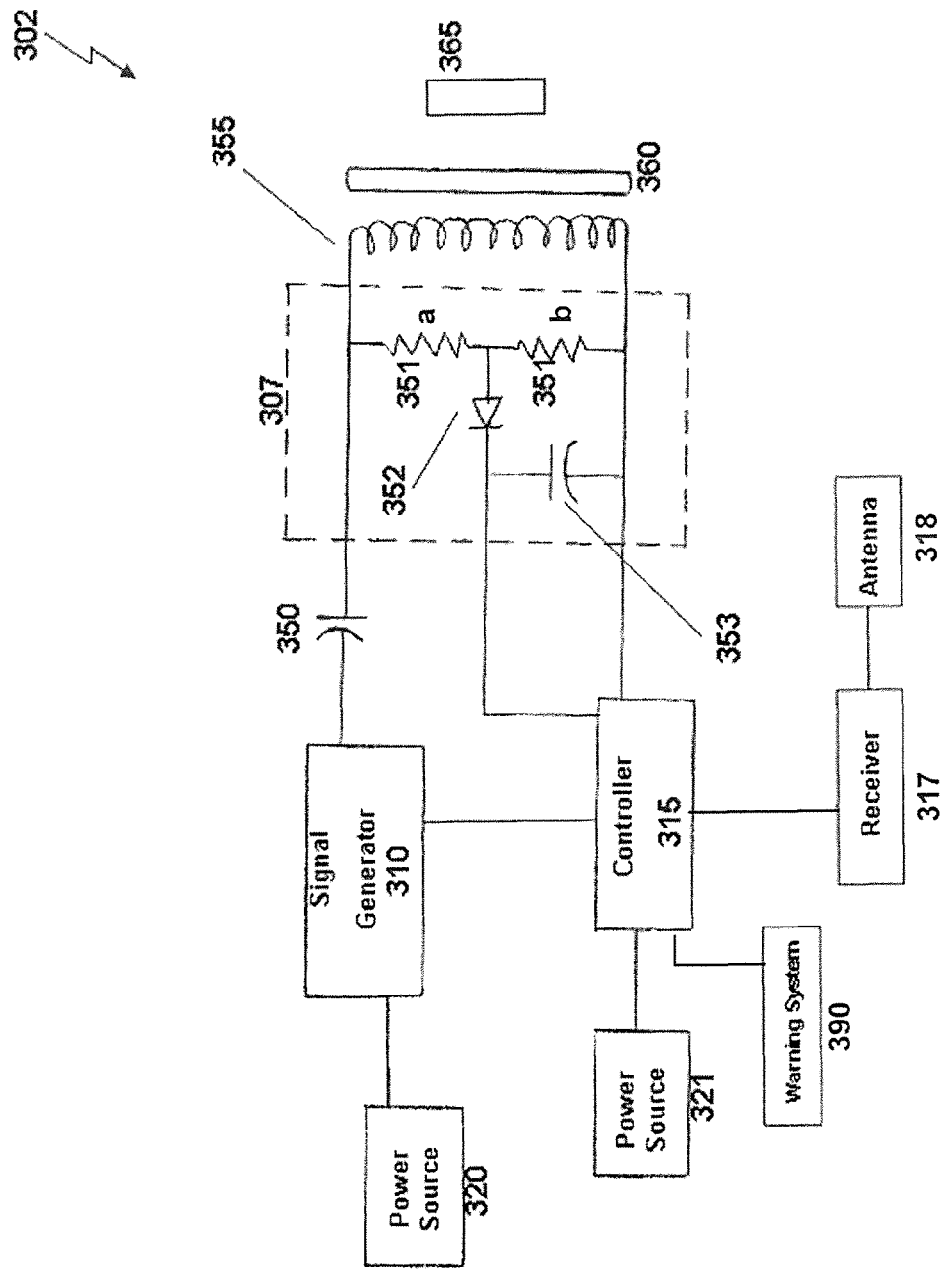
FIG. 4 is a view like FIG. 3 of a second embodiment of a magnetic field generator.

FIG. 4 is a view like FIG. 3 of a second embodiment of a magnetic field generator. A power source 320 powers a signal generator 310 that generates a voltage across an inductor 355 and a first capacitor 350 connected in series. The magnetic field generator also has a ferrite core 360. The inductor 355, first capacitor 350 and ferrite core 360 may be similar to the ones described in the embodiment shown in FIG. 3. A controller 315 controls the operation of the signal generator 310. The magnetic field generator 302 includes a warning system 390, receiver 317, and antenna 318 similar to those described with regard to FIG. 2. The magnetic field generator 302 also includes a movable shunt 365.

The magnetic field generator of FIG. 4 also includes a voltage divider circuit 307. The voltage divider circuit 307 has two resistors 351a and 351b connected in series with each other and in parallel to the inductor 355. One side of a diode 352 is connected between the two resistors 351a and 351b. The other side of the diode 352 is connected to a second capacitor 353 and to an input of the controller 315. One terminal of the second capacitor 353 is connected to the diode 352 and an input of the controller 315. A second terminal of the second capacitor 353 is connected to the inductor 355, one of the resistors 351 and a second input to the controller 315. An output of the controller 315 is connected to the signal generator 310. A power source 320 is connected to the signal generator 310 and a second power source 321 is connected to the controller 315. Alternatively, the signal generator 310 and the controller 315 may share a single power source 320 or 321.

The voltage divider circuit 307 outputs a smaller voltage than the actual voltage across the inductor 355. The voltage output by the voltage divider circuit 307 (the feedback voltage) is input to the controller 315. As described above, the size of the magnetic field produced by the magnetic field generator 302 is related to the voltage across the inductor 355. The feedback voltage output from the voltage divider circuit 307 directly relates to the voltage across the inductor 355. Therefore, the controller may accurately predict the size of the magnetic field according to the voltage output by the voltage divider circuit 307.

In one embodiment, current from the voltage divider circuit 307 passes through the diode 352 into a second capacitor 353 that accumulates charge. The accumulated charge may be read out by the controller 315 and displayed by the magnetic field generator 302. In this manner, the controller 315 may compute the voltage across the inductor 355. The controller 315 may then compute the size of the magnetic field produced by the magnetic field generator 302 based upon the voltage across the inductor 355. A worker may then manipulate the shunt 365 in relation to the inductor 355 and ferrite rod 360 to change the inductance of the inductor 355. Correspondingly, the resonance of the magnetic field generator 302 and the voltage across the inductor 355 will change as well.

In one embodiment, the controller 315 displays a value indicative of the inductance of the inductor 355. For instance, the controller 315 may illuminate a series of lights, such as LEDs, indicating whether the inductance is too low for the magnetic field generator 302 to achieve maximum resonance or whether the inductance is too high for the magnetic field generator 302 to achieve maximum resonance. In another embodiment, the controller may display whether the magnetic field generator 302 is becoming more or less resonant in response to movement of the shunt 365. In an embodiment, the controller 315 may illuminate a light indicating that the magnetic field size produced by the generator 302 has dropped below a predetermined amount. The predetermined amount at which a warning light is illuminated may be adjustable. In an additional embodiment, the controller 315 may adjust the output of the generator 302 to maintain the magnetic field at the predetermined size and, if unable to maintain the predetermined magnetic field size, the controller 315 may cause the warning system 390 to indicate a failure.

In one embodiment, the shunt 365 is fixed in place once the shunt 365 has been manipulated to achieve the desired resonance. The shunt may be fixed in place by a fixing means such as an adhesive or fastener, such as one or more bolts, screws, clips, or clamps. In one embodiment, the shunt may be fixed in place by an adhesive applied through perforated holes in the shunt 365. In another embodiment, the shunt 365 may be held in place by friction. Furthermore, the shunt 365 may be supported in relation to the ferrite core 360 in any suitable manner.

In yet another embodiment, the controller 315 may control the signal generator 310 to change the current, voltage, or voltage pulse width generated by the signal generator 310 in response to an input voltage received by the controller 315 from the voltage divider circuit 307. For instance, the controller 315 may control the signal generator 310 to output a current, voltage, or voltage pulse width that achieves a particular voltage or current across the inductor 355. In one embodiment, the particular current or voltage across the inductor 355 may correspond to a desired magnetic field size produced by the magnetic field generator 302. In another embodiment, the controller 315 may control the signal generator 310 in order to generate a constant voltage across the inductor 355.

Figure 5:
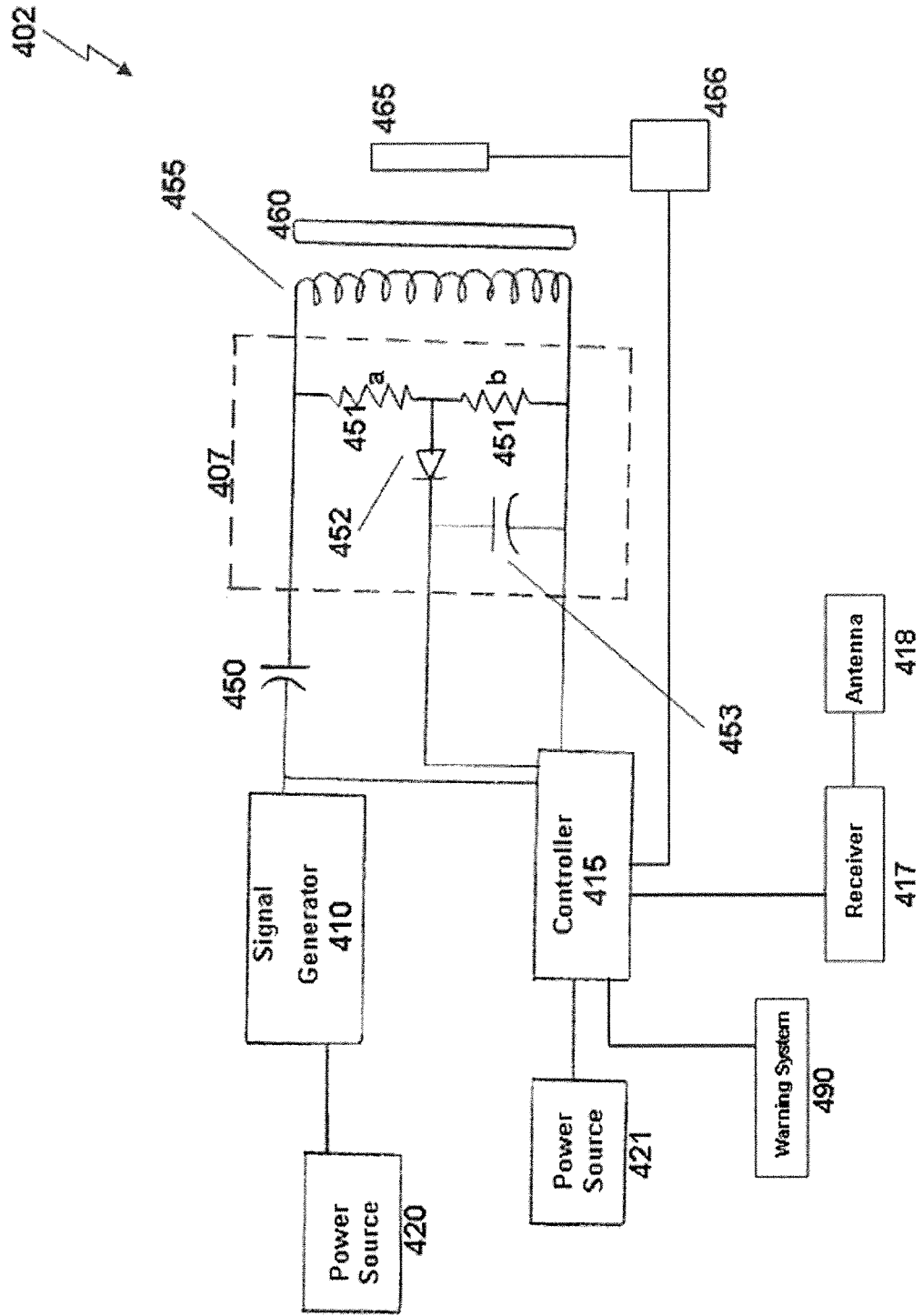
FIG. 5 is a view like FIG. 3 of a third embodiment of a magnetic field generator.

FIG. 5 is a view like FIG. 3 of a third embodiment of a magnetic field generator. The magnetic field generator 402 of FIG. 5 is similar to the magnetic field generator of FIG. 4 in that it includes a signal generator 410, power sources 420, 421, controller 415, warning system 490, receiver 417, antenna 418 first capacitor 450, inductor 455, ferrite core 460, voltage divider circuit 407, resistors 451a, 451b, diode 452, and second capacitor 453. The magnetic filed generator 402 also includes an automatically adjustable member 466 for controlling the position of the shunt 465. The shunt 465 may be supported in relation to the ferrite core 460 in any suitable manner. The automatically adjustable member 466 is physically connected to the shunt 465 and includes a device to adjust the position of the shunt 465, such as a linear actuator, servo, hydraulic, electrically activated polymer, or other device. The automatically adjustable member 466 is also connected to the controller 415. As described above, the controller 415 receives a signal from the voltage divider circuit 407 that is indicative of the voltage across the inductor 455. The controller 315 may output a signal to the automatically adjustable member 466 that causes the automatically adjustable member 466 to move the shunt 465 in relation to the inductor 455 and the ferrite core 460.

In one embodiment of the magnetic field generator of FIG. 5, the controller 415 controls the automatically adjustable member 466 to move the shunt 465 to maximize the resonance of the magnetic field generator 402. At a maximum resonance of the magnetic field generator 402, the current across the inductor 455 is at a maximum value for a given voltage. In one embodiment, the controller 415 may adjust the position of the shunt 465 in relation to the inductor 455 and ferrite core 460 in order to maximize the current flowing through the inductor 455. In another embodiment, the controller 415 may control the automatically adjustable member 466 to move the shunt 465 to increase or decrease the voltage across the inductor 455 and, correspondingly, the size of the magnetic field generated by the magnetic field generator 402. In various embodiments, the automatic adjustment of the shunt may be performed at various time intervals, such as at startup of the magnetic field generator, or may be ongoing.

Figure 7:
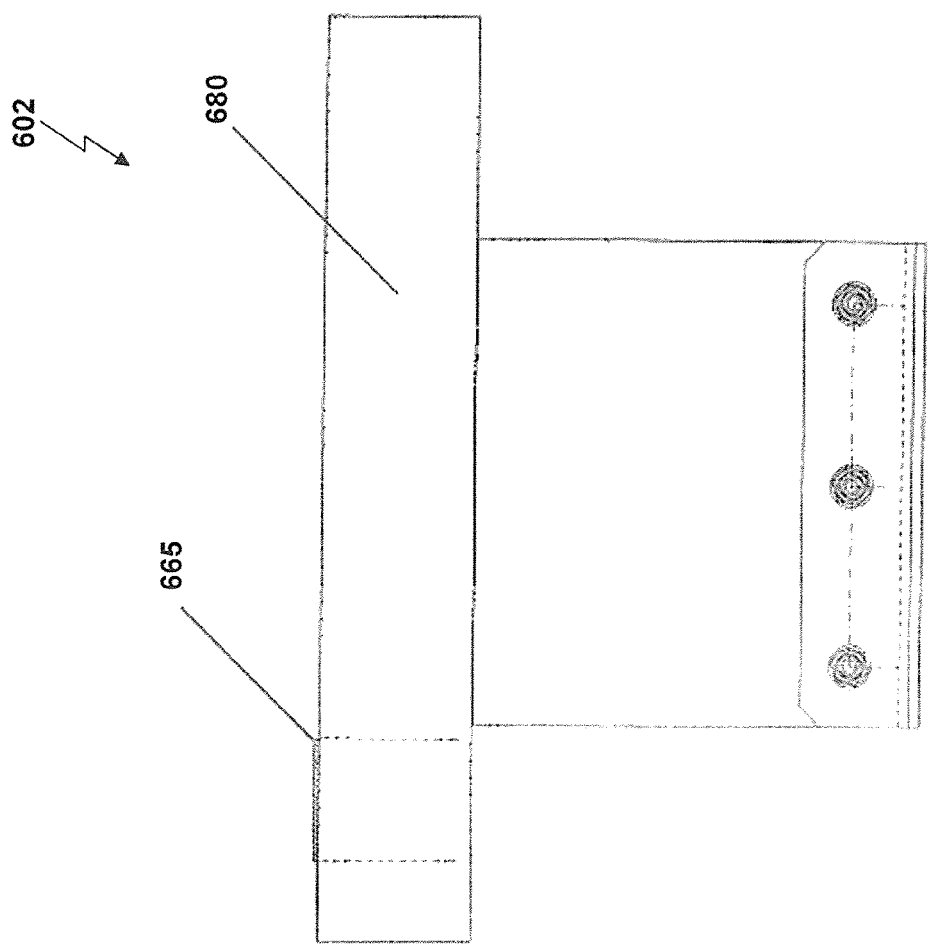
FIGS. 6 and 7 are diagrams of a portion of an exemplary magnetic field generator of the system of FIG. 2 in accordance with an embodiment described herein.
Figure 6:
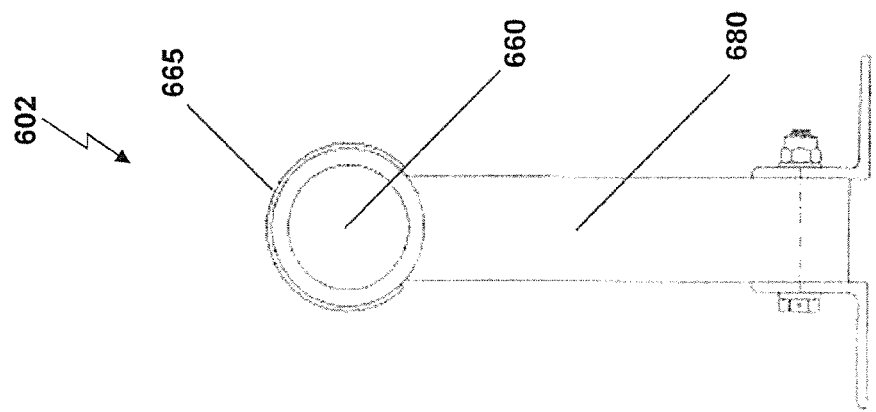

FIG. 6 shows a cutaway profile view and FIG. 7 shows a side view of a portion of another exemplary magnetic field generator in accordance with another embodiment. The magnetic field generator 602 includes a housing 680. Within the housing is a ferrite core 660 and an inductor. As can be seen in FIGS. 6 and 7, a partially cylindrical shunt 665 partially surrounds an exterior of the magnetic field generator housing 680. The shunt 665 may be supported in relation to the ferrite core 660 in any suitable manner. In one embodiment, the shunt 665 may be manually moved longitudinally along the surface of the magnetic field generator housing. In another embodiment, an automatically adjustable means and controller may automatically move the shunt along the magnetic field generator housing 680.

In one embodiment, the ferrite core 660 may have a diameter of approximately 1-1.5 inches and length of approximately 10-12 inches. In the embodiment shown in FIGS. 6 and 7, the diameter of the magnetic field generator housing 680 is approximately 0.5 inches larger than the diameter of the ferrite core 660. Because mounting the magnetic field generator 602 on a solid metal surface may adversely affect the magnetic field generated by the magnetic field generator 602, in the embodiment shown in FIGS. 6 and 7, the magnetic field generator 602 in the embodiment shown in FIGS. 6A and 6B is mounted at least a distance equal to the length of the ferrite core 660 away from a solid metal surface.

FIG. 8 shows a cutaway profile view and FIG. 9 shows a side view of a portion of another exemplary magnetic field generator in accordance with another embodiment. The magnetic field generator 702 has an explosive-proof inner housing 782 at least partially surrounding the ferrite core 760 and inductor. A shunt 765 at least partially surrounds the explosive-proof inner housing 782, ferrite core 760 and inductor. The shunt 765 may be supported in relation to the ferrite core 760 in any suitable manner. The shunt 765 is completely surrounded by a polycarbonate outer housing 781. In one embodiment, a non-metallic housing support 789 is located between the magnetic field generator 702 and the mounting surface 787. In the embodiment shown in FIGS. 8 and 9, the magnetic field generator 702 is attached to the mounting surface 787 and non-metallic housing support 789 with U-bolts 788. However, the mounting configuration shown in FIGS. 8 and 9 is merely one of many possible configurations of mounting the magnetic field generator 702. The embodiment of FIGS. 8 and 9 is capable of "in-by" use (i.e. within hazardous work zones within a prescribed distance of a mine-cutting surface) because of the use of an explosive-proof inner housing 782.

In-by use capabilities may be of particular importance in the underground mining industry. For instance, in South Africa, a worker or machine is considered to be in-by if they are within 180 meters of the cutting face of a mine. Any equipment operating within 180 meters of the cutting face must be explosive proof and flame proof. Locations beyond 180 meters from the cutting face are considered to be "out-by" and generally have less stringent regulations for equipment. A third classification zone exists for equipment operating exclusively above ground. The embodiment of FIGS. 8 and 9 is suitable for use in in-by mining situations.

Figure 10:
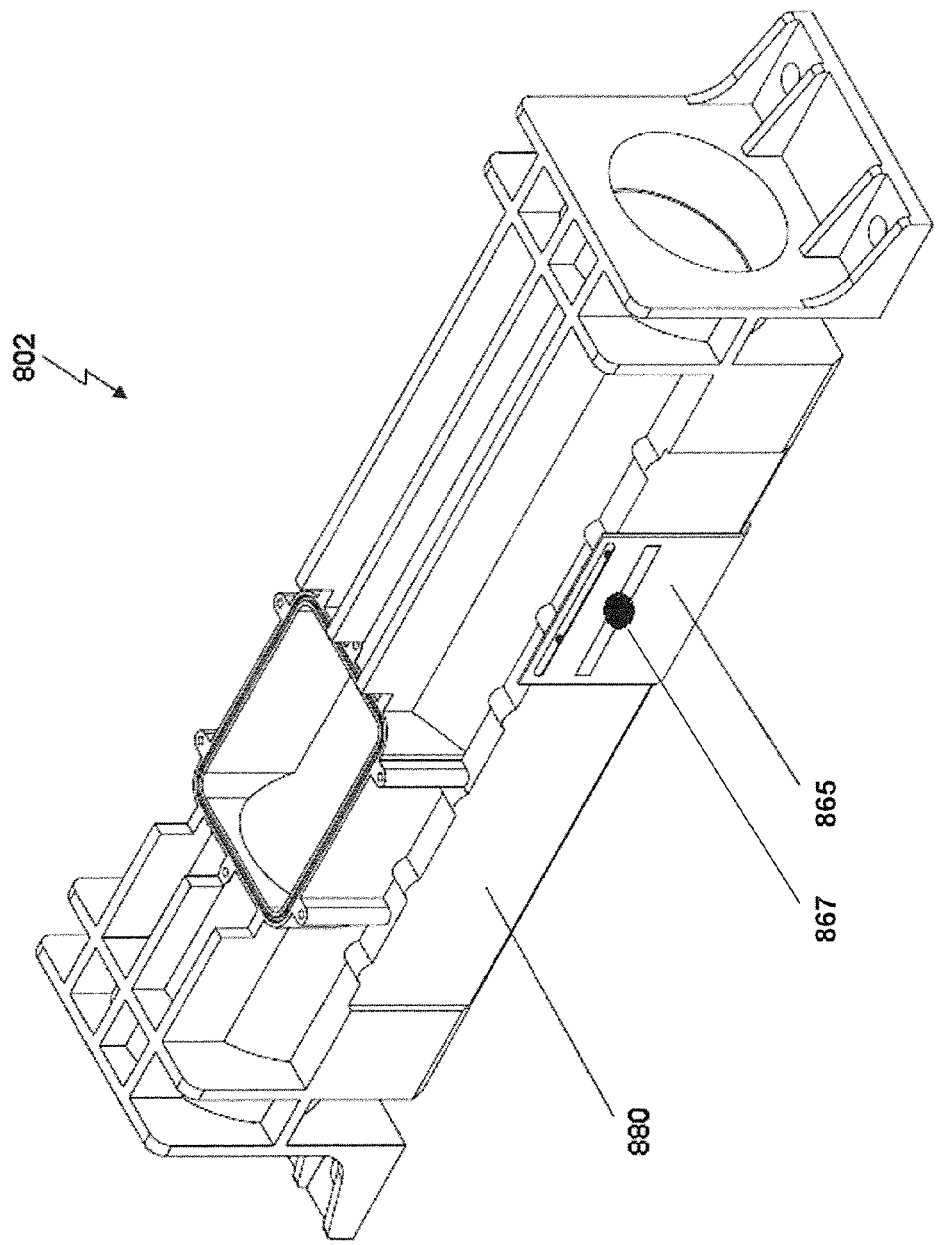
FIG. 10 is a diagram of a portion of an exemplary magnetic field generator of the system of FIG. 2 in accordance with another embodiment described herein.
Figure 11:
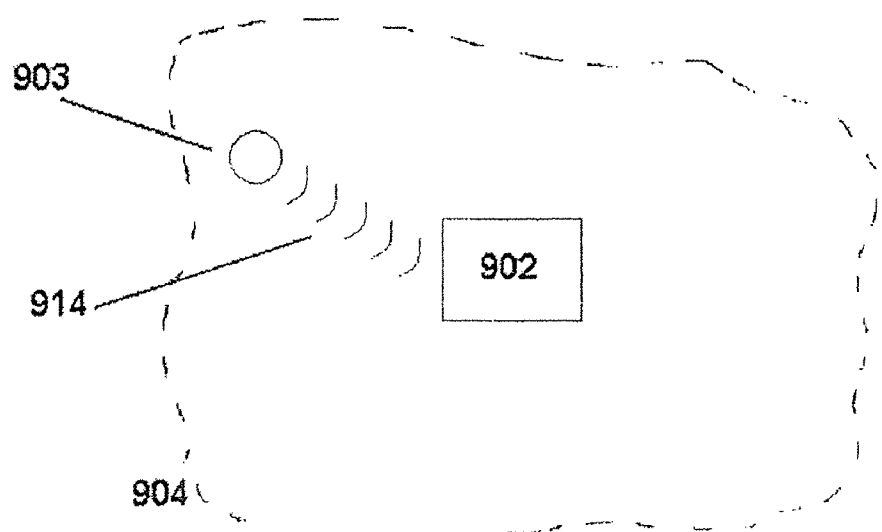
FIG. 11-15 are diagrams of an exemplary method for calibrating a proximity detection system in accordance with an embodiment described herein.

FIG. 10 shows another exemplary magnetic field generator in accordance with another embodiment of the magnetic field generator. The magnetic field generator 802 has a polycarbonate housing 880 and a magnetic shunt 865 partially surrounding the magnetic field generator 802. For instance, the magnetic shunt 865 may surround the magnetic field generator 802, on one, two, three sides or four sides. In one embodiment, the magnetic shunt 865 may be slid longitudinally along the polycarbonate housing 880 of the magnetic field generator 802. A screw, adhesive or other fastening device 867 may be used to hold the shunt 865 in place relative to the polycarbonate housing 880 in between movements of the shunt 865. The shunt 865 may be supported in relation to the magnetic field generator 802 in any suitable manner.

Figure 12:
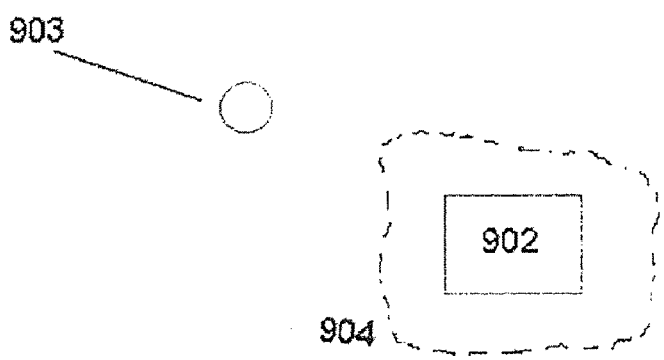
Figure 13:
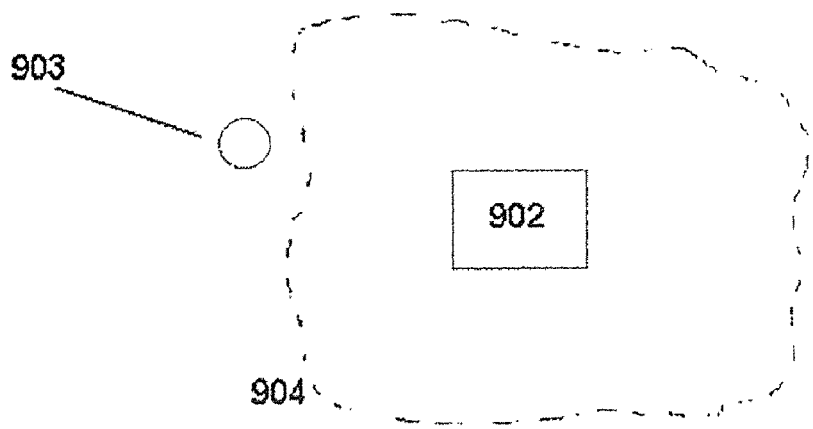
Figure 14:
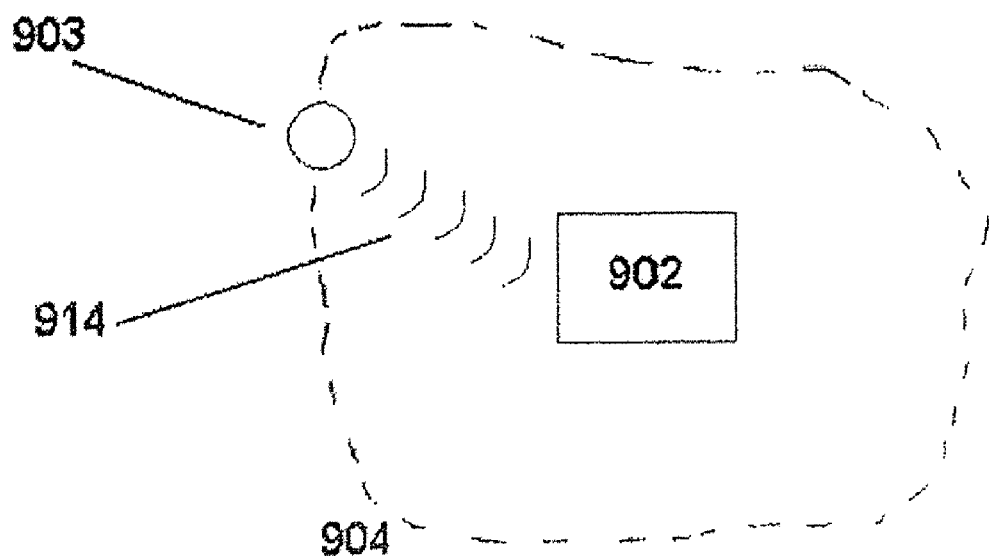

FIGS. 11-15 are diagrams of an exemplary method for calibrating a proximity detection system in accordance with an embodiment. It may be necessary upon installation or at other times to calibrate the proximity detection system in order to properly define a distance at which a personal alarm device 903 becomes dangerously close to the magnetic field generator 902, and more importantly, to the dangerous equipment on which the magnetic field generator 902 may be mounted. In one embodiment, with reference to FIG. 11, the magnetic field generator 902 is calibrated by placing a personal alarm device 903 at a distance at which a warning zone is to be defined for the magnetic field generator 902 and equipment. The personal alarm device 903 searches for the magnetic field 904 produced by the magnetic field generator 902 and responds with an RF signal once the magnetic field 904 is detected. As shown in FIG. 12, if the magnetic field 904 is detected by the personal alarm device 903, the magnetic field generator 902 decreases the size of the magnetic field 904 until the personal alarm device 903 no longer detects the presence of the magnetic field 904. As shown in FIG. 13, once the personal alarm device 903 no longer detects the presence of the magnetic field 904, the magnetic field generator 902 begins to incrementally increase the size of the magnetic field 904. As shown in FIG. 14, the size of the magnetic field 904 is incrementally increased until the personal alarm device again detects the presence of the magnetic field 904 and responds to the magnetic field generator 902 with an RF signal 914.

Figure 15:
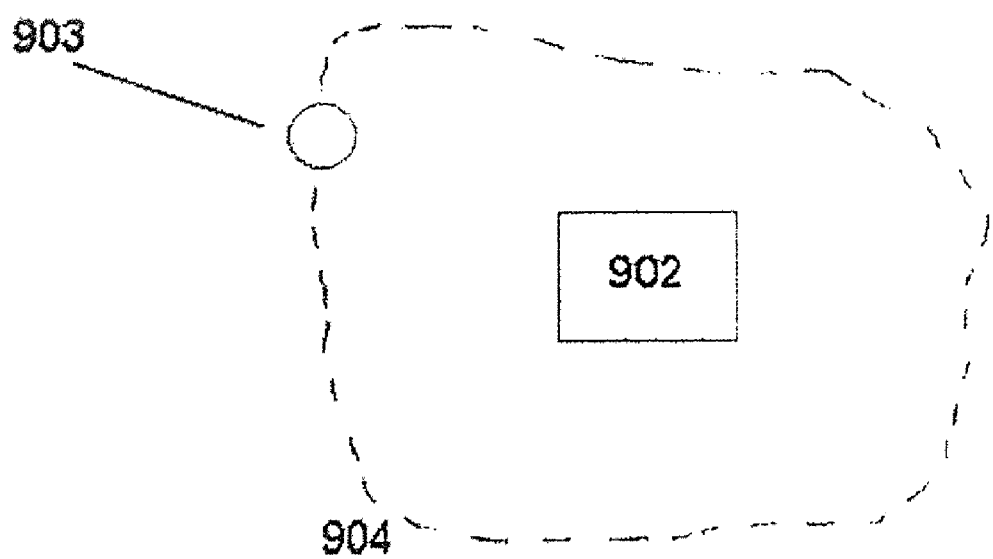
Figure 16:
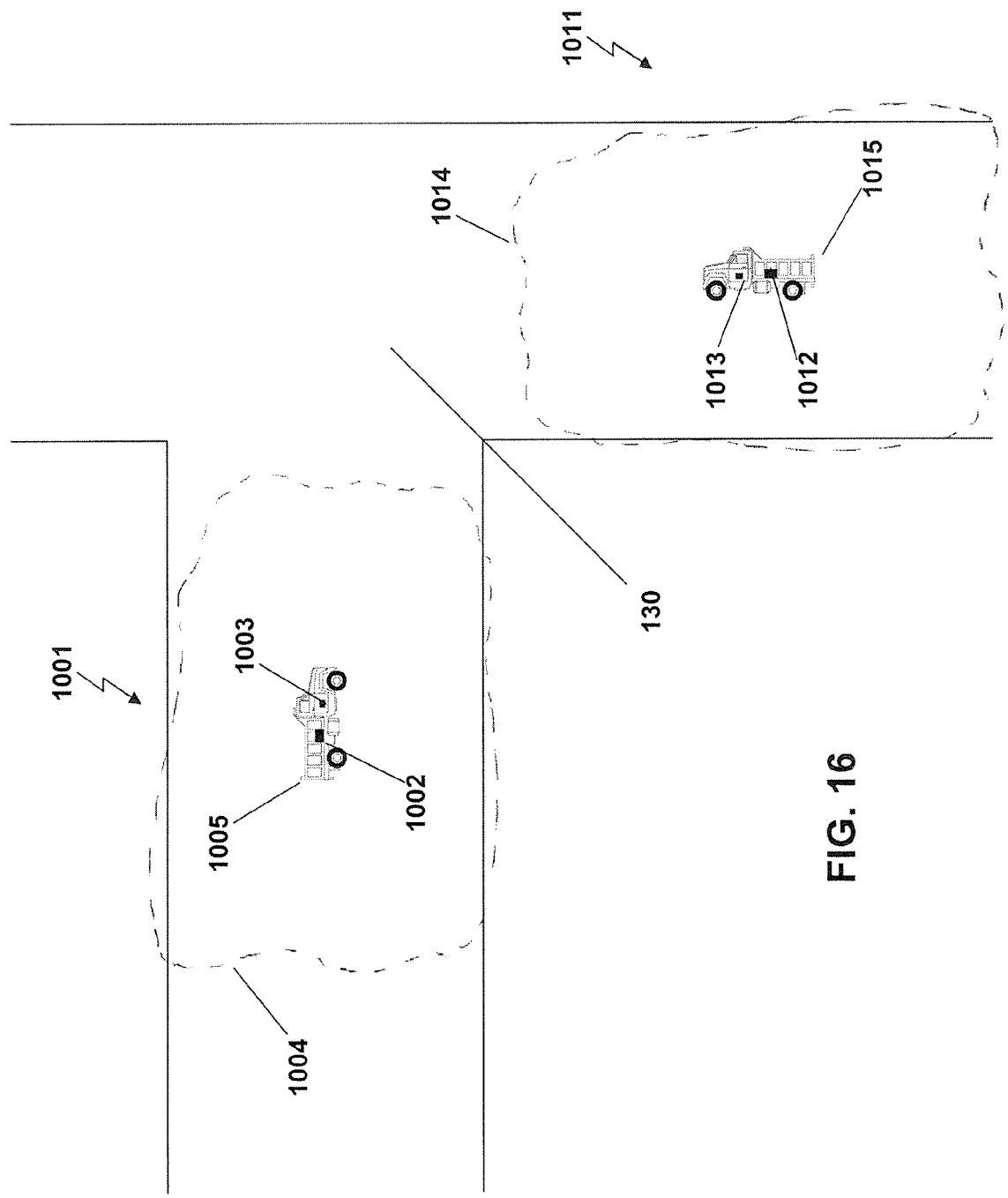
FIGS. 16 and 17 are diagrams of an exemplary method for detecting impending collisions using the proximity detection system in accordance with an embodiment described herein.

With reference to FIG. 15, the controller within the magnetic field generator 902 records the voltage across the inductor at which the magnetic field 904 was first detected by the personal alarm device and maintains the voltage across the inductor at this recorded level. The magnetic field generator 902 may maintain a magnetic field 904 having a constant size by holding the voltage across the inductor constant. In one embodiment, the controller maintains a constant voltage across the inductor by adjusting the pulse width of the voltage generated by the signal generator. In another embodiment, the controller adjusts the voltage output of the signal generator. In still another embodiment, the controller adjusts the current output of the voltage generator. In yet another embodiment, the controller automatically adjusts the position of the shunt. In other embodiments, combinations of the previous embodiments may be employed in order to keep the magnetic field 904 at a constant size.

In another embodiment for calibrating a proximity detection system, a power level across the inductor of the magnetic field generator 902 is selected by the operator. In one embodiment, the power level may be automatically set by the controller or some other means. Further, in one embodiment, and in further reference to FIG. 4, the power level is set by software in the controller 315 to a level that is less than the maximum power level of the magnetic field generator 302. For example, the power level may be set at 90%-95% of the maximum power level, or even lower if required. This may enable the controller 315 to adjust the power output to a higher level if required for control of degrading output due to conditions differing from the factory or laboratory, as explained earlier. Once a power level has been selected, the shunt 365 may be adjusted on the generator 302 to achieve maximum power output. If more than one magnetic field generator 902 is used, in order to achieve a special field shape, the shunts may be adjusted differently on each generator. The final size of the magnetic field 904 may then be checked to assure that the magnetic field 904 is not excessively large for the working environment, such that nuisance alarms could become a problem. If the magnetic field 904 produced by the magnetic field generator 902 is determined to be too large, a personal alarm device 903 is placed at the location where the magnetic field 904 boundary should be located and the calibration sequence described above is activated at the controller 315. The controller 315 may then reduce the size of the magnetic field 904 and, subsequently, incrementally increase the size of the magnetic field 904 until the personal alarm device 903 indicates that the magnetic field 904 has reached the personal alarm device 903. Having achieved the desired magnetic field 904 size, the controller 315 may record the feedback voltage from the inductor 355 and control the voltage across the inductor 355 to maintain the feedback voltage as recorded. By this method, the magnetic field generator 902 may generate a magnetic field 904 that is maintained at the chosen size and shape, even with changing conditions, such as temperature, or degradation of components over time. Maintaining a fixed magnetic field 904 size and shape is very important to provide the required safety zone and to also prevent nuisance alarms that result from the use of excessively large safety zones or zones not having the needed shape.

Figure 17:
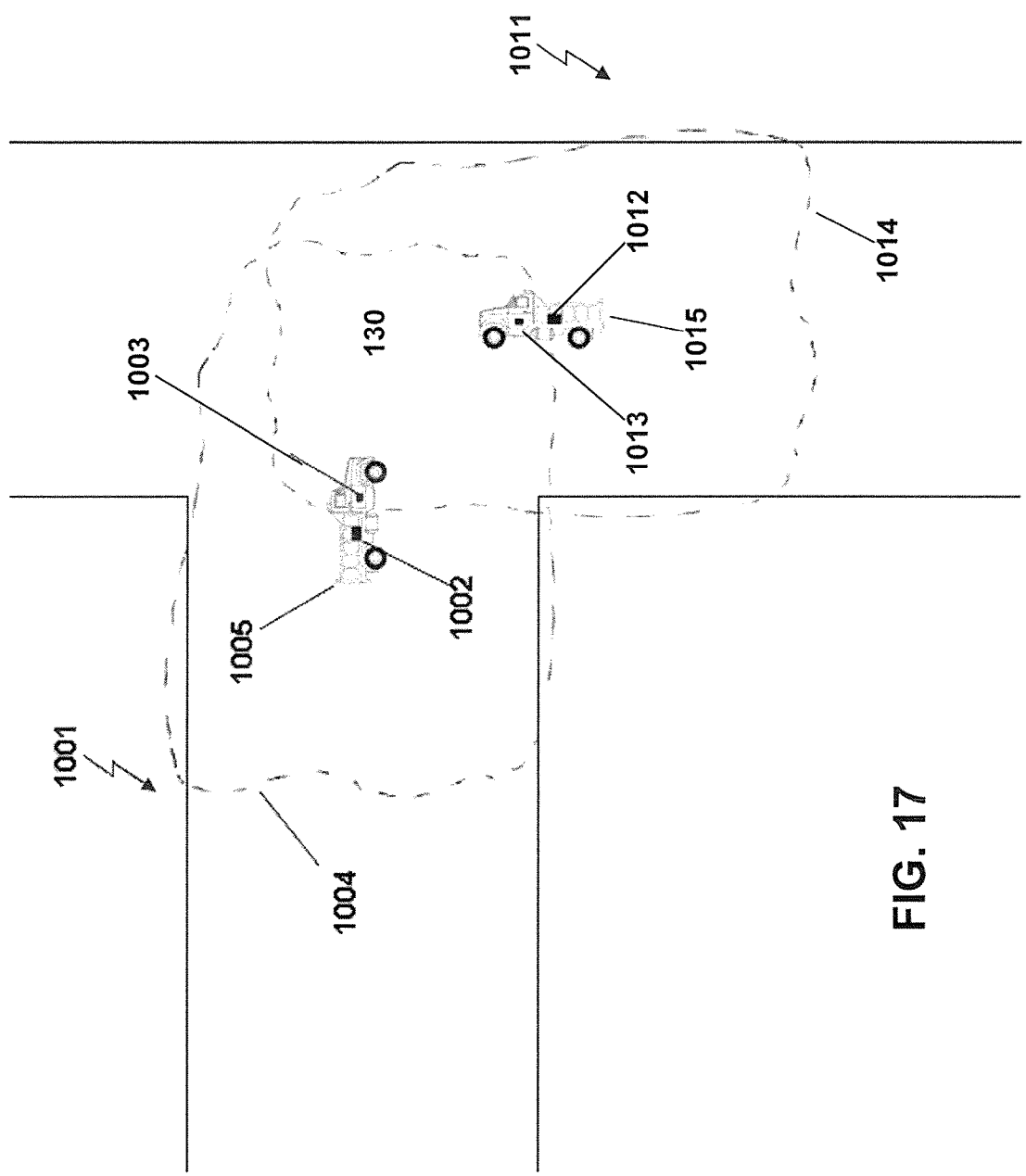

With reference to FIG. 17, as the two vehicles 1005, 1015 approach one another at an intersection 130, the personal alarm devices 1003, 1013 on each vehicle 1005, 1015 detects the magnetic fields 1004, 1014 produced by the magnetic field generator 1002, 1012 mounted on the other vehicle 1005, 1015. The personal alarm devices 1003, 1013 and/or the magnetic field generators 1002, 1012 issue warnings to the operators of each vehicle 1005, 1015 warning the operators of their dangerous proximity. In one embodiment, only the personal alarm device 1003, 1013 or magnetic field generator 1002, 1012 issues a warning. In another embodiment, the personal alarm devices 1003, 1013 or magnetic field generators 1002, 1012, may automatically slow or stop their respective vehicles 1005, 1015. Because of the momentum with which construction vehicles typically travel, in one embodiment, the magnetic field 1004, 1014 produced by the magnetic field generator 1002, 1012 may be larger than typical magnetic fields generated by the proximity detection system.

While embodiments have been described in detail in connection with the embodiments known at the time, it should be readily understood that the claimed magnetic field generator is not limited to the disclosed embodiments. Rather, the embodiments can be modified to incorporate any number of variations, alterations, substitutions or equivalent arrangements not heretofore described. For example, many configurations of the housing and mounting methods for the housing may be practiced. The magnetic field generator is not limited to the housing configurations herein described.

The invention claimed is:

1. A magnetic field generator, comprising:
   a signal generator for outputting a voltage,
   a magnetic field generating circuit for generating a magnetic field, wherein the magnetic field generating circuit comprises:
      a capacitor, and
      an inductor comprising a ferrite core, and
      a shunt movably supported relative to the inductor such that moving the shunt changes a value of inductance in the magnetic field generating circuit.

2. The magnetic field generator of claim 1, wherein the shunt at least partially surrounds the ferrite core.

3. The magnetic field marker generator of claim 2, wherein the shunt is cylindrical.

4. The magnetic marker field generator of claim 1, wherein the shunt is manually adjustable.

5. The magnetic marker field generator of claim 1, wherein the shunt is automatically adjustable.

6. The magnetic field generator of claim 1, wherein the shunt comprises aluminum.

7. The magnetic field generator of claim 1, wherein the shunt is positioned relative to the inductor such that a resonance of the magnetic field generating circuit is at its maximum value for a given voltage.

8. The magnetic field generator of claim 1, wherein the shunt further comprises a restraining means for fixing the position of the shunt relative to the inductor.

9. The magnetic field marker generator of claim 8, wherein the restraining means is one of the group consisting of a fastener, an adhesive, a screw and a friction pad.

10. The magnetic field generator of claim 1, further comprising a controller for detecting at least one physical property of the magnetic field generating circuit.

11. The magnetic field generator of claim 10, wherein the physical property is voltage or current.

12. The magnetic field generator of claim 10, further comprising a voltage divider affixed circuit across the inductor.

13. The magnetic field generator of claim 10, further comprising an adjustable member for moving the shunt.

14. The magnetic field generator of claim 13, wherein the controller manipulates the adjustable member so as to position the shunt relative to the inductor such that a resonance of the magnetic field generating circuit is at its maximum value.

15. The magnetic field generator of claim 1, further comprising an explosion proof housing, wherein the magnetic field generator comprising the explosion proof housing satisfies safety standards for in-by use.

16. The magnetic field generator of claim 1, further comprising a housing surrounding the capacitor and inductor, wherein the shunt is movably affixed to an exterior surface of the housing.

17. A method for adjusting the resonance of a magnetic field generator, comprising:
   installing a magnetic field generator at a location at which the magnetic field generator is to be used, the magnetic field generator comprising:
      a signal generator for outputting a voltage,
      a magnetic field generating circuit for generating a magnetic field, wherein the magnetic field generating circuit comprises:
         a capacitor, and
         an inductor comprising a ferrite core, and
         a shunt movably supported relative to the inductor such that moving the shunt changes a value of inductance in the magnetic field generating circuit, and
   moving the shunt relative to the inductor to increase the resonance of the magnetic field generating circuit for a given voltage.

18. The method of claim 17, further comprising adjusting an adjustable member attached to the shunt to move the shunt with respect to the inductor.

19. The method of claim 18, further comprising adjusting the adjustable member to maximize the resonance of the magnetic field generator.

20. The method of claim 18, further comprising manually adjusting the adjustable member.

21. The method of claim 18, further comprising automatically adjusting the adjustable member.

22. The method of claim 18, further comprising adjusting the adjustable member using a controller.

23. The method of claim 17, further comprising detecting a change in the voltage across the inductor and indicating the change in the voltage across the inductor using an indicator.

24. A proximity detection system, comprising:
   a plurality of alarm devices for detecting a magnetic field, and
   a magnetic field generator comprising:
      a signal generator for outputting a voltage,
      a capacitor in electronic communication with the signal generator,
      an inductor in electronic communication with the capacitor,
      a ferrite core at least partially surrounded by the inductor, and
      a shunt movably supported relative to the inductor such that moving the shunt changes a value of inductance in the magnetic field generator.

25. The proximity detection system of claim 24, further comprising a controller for automatically moving the shunt, the controller comprising:
   a means for causing movement of the shunt, and
   a computing device for generating a control signal to cause the means for causing movement of the shunt to manipulate the shunt.

26. The proximity detection system of claim 24, wherein the plurality of alarm devices are designed to be worn by people.

27. The proximity detection system of claim 24, wherein the plurality of alarm devices are designed to be mounted on vehicles.

28. A method for adjusting the range of a magnetic field generated by a magnetic field generator for a proximity detection system, comprising:
   installing a magnetic field generator at a location,
   positioning a personal alarm device at a distance from the magnetic field generator,
   generating a magnetic field using the magnetic field generator, wherein the magnetic field encompasses the personal alarm device,
   detecting the magnetic field with the personal alarm device,
   decreasing the magnetic field size until the personal alarm device cannot detect the magnetic field,
   incrementally increasing the magnetic field size until the personal alarm device detects the magnetic field, and
   setting the magnetic field size equal to the magnetic field size at which the personal alarm device detected the magnetic field.

29. A method for adjusting the range of a magnetic field generated by a magnetic field generator for a proximity detection system, comprising:
   installing a magnetic field generator at a location,
   selecting a power level of the magnetic field generator less than the maximum power level of the magnetic field generator,
   generating a magnetic field by operating the magnetic field generator at the selected power level,
   adjusting the position of a shunt relative to the magnetic field generator to maximize the size of the magnetic field generated by the magnetic field generator at the selected power level,
   positioning a personal alarm device at a distance from the magnetic field generator, and
   adjusting the magnetic field generator to generate a magnetic field having a boundry located at approximately the distance of the personal alarm device.

30. A proximity detection system comprising:
   a first magnetic field generator for generating a first oscillating magnetic field, wherein the first magnetic field generator is arranged on a first vehicle,
   a second magnetic field generator for generating a second oscillating magnetic field, wherein the second magnetic field generator is arranged on a second vehicle,
   a first magnetic field detector capable of detecting the second oscillating magnetic field and providing a visual and/or audible warning to an operator of the first vehicle upon detecting the second oscillating magnetic field, wherein the first magnetic field detector is arranged on the first vehicle, and
   a second magnetic field detector capable of detecting the first oscillating magnetic field and providing a visual and/or audible warning to an operator of the second vehicle upon detecting the first oscillating magnetic field, wherein the second magnetic field detector is arranged on the second vehicle.

* * * * *